United States Patent [19]

Fischer et al.

[11] Patent Number: 5,502,407
[45] Date of Patent: Mar. 26, 1996

[54] LOW-POWER-DISSIPATION CMOS CIRCUITS

[75] Inventors: Wilhelm C. Fischer, Westfield; Thaddeus J. Gabara, Murray Hill, both of N.J.

[73] Assignee: AT&T Corp., Murray Hill, N.J.

[21] Appl. No.: 348,388

[22] Filed: Dec. 2, 1994

[51] Int. Cl.[6] .............................................. H03K 19/0948
[52] U.S. Cl. .................... 326/95; 326/98; 327/544
[58] Field of Search ............................ 326/21, 95, 98, 326/121; 327/199, 544

[56] References Cited

U.S. PATENT DOCUMENTS 3,983,412  9/1976  Roberts et al. ............................ 327/55

OTHER PUBLICATIONS

Seitz et al.; "Hot–Clock nMOS"; published 1, Proceedings of the 1985 Chapel Hill Conference on VLSI, Computer Science Press, 1985.

Younis et al.; "Practical Implematation at Charge Recovering Asymptotically Zero Power CMOS", Artificial Intelligence Lab., Massachusetts Institute of Technology; Oct. 9, 1992.

T. Gabara, "Pulse Power Supply—PPS CMOS", 1994 IEEE Symposium on Low Power Electronics, pp. 98–99.

Primary Examiner—Edward P. Westin
Assistant Examiner—Benjamin D. Driscoll

[57] ABSTRACT

In low-power-dissipation CMOS circuitry, conventional CMOS inverters are powered by a repetitively ramped power supply. Clock signals are needed in the circuitry for controlling data flow therein. To ensure optimal low-power operation of the circuitry, clock signals are derived directly from the ramped power supply waveform itself. Additionally, a technique similar to that employed in the clock-signal-generating arrangement is utilized to propagate digital data signals between chips in a low-power way.

5 Claims, 4 Drawing Sheets

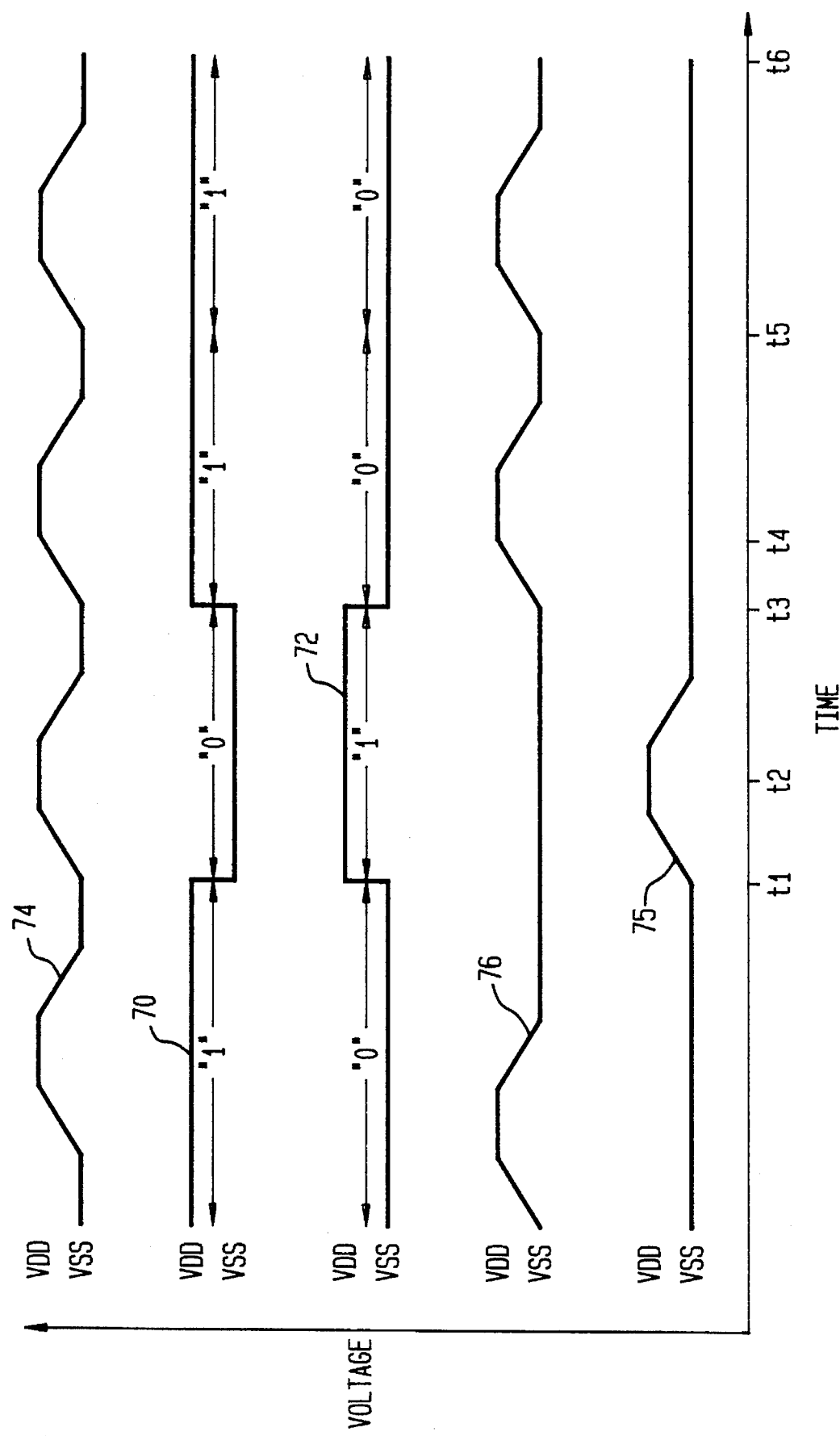

5,502,407

LOW-POWER-DISSIPATION CMOS CIRCUITS

BACKGROUND OF THE INVENTION

This invention relates to low-power-dissipation circuits and, more particularly, to low-power-dissipation circuits fabricated in integrated-circuit form utilizing complementary metal-oxide-semiconductor (CMOS) technology.

It is known that low power dissipation in a conventional CMOS circuit can be achieved if the power supply lead of the circuit is ramped repetitively between VDD and VSS. During the so-called power-down phase of each ramped cycle, the state of the circuit is stored on parasitic capacitances. This quasi-static CMOS circuit technique is called PPS (pulsed power supply) CMOS and is characterized by a power dissipation property that is typically approximately an order of magnitude less than that of conventional CMOS circuits powered by a fixed-value power supply. The technique is described in "Pulsed Power Supply CMOS - PPS CMOS" by T. J. Gabara, *Proceedings of 1994 Symposium on Low Power Electronics*, pages 98–99. Further, the technique is described in T. J. Gabara's copending commonly assigned U.S. patent application designated Ser. No. 08/225,950, filed Apr. 8, 1994.

Reliable low-power operation of PPS circuits on a chip requires accurate clock signals that are consistently synchronous with the occurrence of the pulsed power supply waveform. The clock signals are utilized to synchronize data flow on the chip. In particular, the clock signals are employed to control the operation of all clocked PPS circuits such as PPS latches and flip-flops. Also, clock signals are needed on the chip to time the operation of conventional CMOS latches and flip-flops. And, for controlling the operation of both conventional and PPS master/slave-type latches, complementary clock signals are required.

In practice, the generation of clock signals that have a prescribed waveform and that are synchronous with PPS signals, and that remain so over time, is a challenging task. This is particularly true if during operation of a chip the characteristics of the PPS waveform should change. And if the clock and PPS signals do, for whatever reason, fall out of phase, the advantageous low-power properties of the PPS circuits are thereby deleteriously affected.

Additionally, the transmission of data signals between chips is another area in which considerations of power dissipation in CMOS circuits are extremely important. This is so due to the fact that the interconnections between chips typically exhibit a high-capacitance characteristic. Hence, conventional CMOS driver circuits utilized to propagate signals from one chip to another inevitably consume an undesirably large amount of power.

SUMMARY OF THE INVENTION

In accordance with the principles of the present invention, clock signals suitable for timing CMOS circuits are generated directly from the PPS waveform itself. In one particular embodiment, conventional CMOS circuitry responsive to the PPS waveform provides complementary rectangular signals whose frequency of occurrence is one-half that of the PPS signals. In turn, the rectangular signals are respectively applied to PPS CMOS circuits which respond thereto by providing the complementary clock signals. The frequency of the clock signals matches that of the rectangular signals and the waveforms of the clock signals correspond to portions of the PPS waveform.

In accordance with another feature of the invention, rectangular signals representative of data to be transmitted from one chip to another are respectively applied to PPS CMOS circuits that constitute output buffers on one of the chips. These relatively low-power-dissipation output buffers on the transmitting chip drive high-capacitance interconnect lines that extend between the chips. PPS-type signals representative of the data are thereby propagated between the chips. In one particular embodiment, a self-timed flip-flop circuit on the receiving chip responds to the transmitted PPS-type signals and converts them back to complementary rectangular signals representative of the originally provided data.

BRIEF DESCRIPTION OF THE DRAWING

A complete understanding of the present invention and of the above and other features and advantages thereof will be apparent from the detailed description below taken in conjunction with the accompanying drawing, in which:

and FIG. 4 shows the waveforms of various signals applied to and generated by the FIG. 3 circuitry.

DETAILED DESCRIPTION

Figure 1:
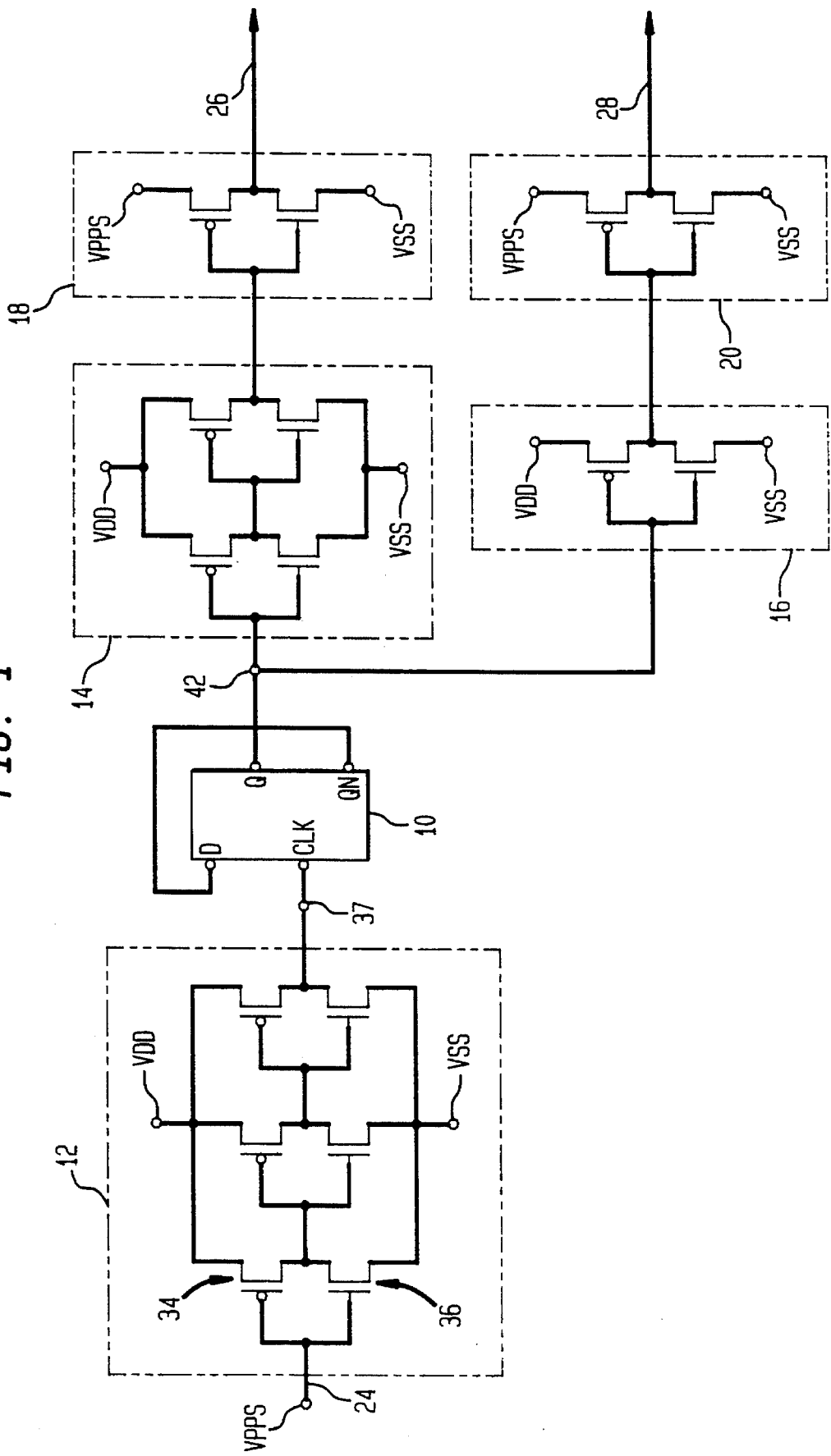
FIG. 1 is a schematic representation of a specific illustrative clock-signal-generating circuit made in accordance with the principles of the present invention.

The specific illustrative clock-signal-generating circuit shown in FIG. 1 includes a conventional flip-flop 10, three conventional series-connected CMOS inverters 12 powered by a fixed-value direct-current power supply (designated VDD), two conventional series-connected CMOS inverters 14 powered by a fixed-value direct-current power supply (VDD), a single conventional CMOS inverter 16 powered by a fixed-value direct-current power supply (VDD) and two conventional CMOS inverters 18 and 20 powered by a pulsed power supply (VPPS).

The fixed-value direct-current power supplies depicted in the drawing each have a positive terminal designated by the notation VDD. By way of example, VDD will be assumed herein to have a value of about +5 volts. The other terminal of the direct-current power supply is designated VSS and is typically connected to a point of reference potential such as ground.

One terminal of the pulsed power supply that powers the inverters 18 and 20 of FIG. 1 is designated herein as VPPS. The other terminal of the pulsed power supply is designated VSS and is, for example, connected to a point of reference potential such as ground. In accordance with the principles of PPS CMOS, the waveform of VPPS is ramped repetitively between VDD and VSS, as illustrated by waveform 22 in FIG. 2.

Figure 2:
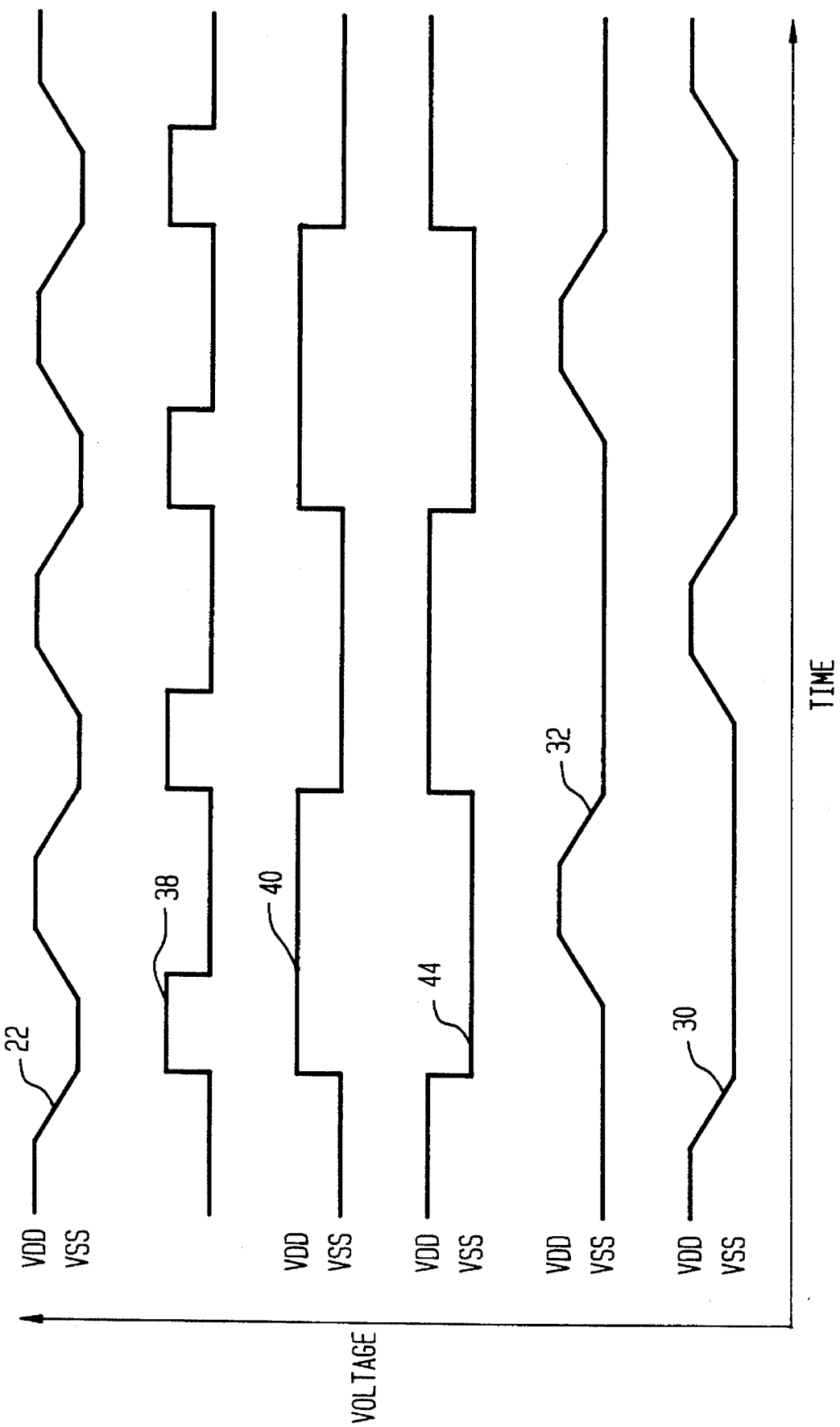
FIG. 2 shows the waveforms of various signals that are applied to and generated by the FIG. 1 circuit.

The input applied to the clock-signal-generating circuit of FIG. 1 is the VPPS waveform itself. This is indicated in FIG. 1 wherein VPPS is shown connected to input line 24. In response to VPPS applied to the line 24, the particular depicted circuit generates complementary clock signals which appear on output lines 26 and 28, respectively. Specifically, the waveforms of the clock signals that appear on the output lines 26 and 28 are represented in FIG. 2 wherein they are respectively designated by reference numerals 30 and 32.

Except for the manner in which they are powered, all of the CMOS inverters shown in FIG. 1 are conventional and identical to each other. Each such inverter comprises series-connected p-channel and n-channel MOS transistor devices. Thus, for example, the first or left-hand one of the inverters included in the block 12 of FIG. 1 comprises a p-channel device 34 connected in series with an n-channel device 36.

More specifically, the source electrode of the p-channel device 34 of FIG. 1 is connected to VDD, the drain electrode of the device 34 is connected to the drain electrode of the device 36 and the gate electrode of the device 34 is connected to the input line 24. Further, the source electrode of the n-channel device 36 is connected to VSS and its gate electrode is also connected to the input line 24. And the output of the inverter comprising the devices 34 and 36 is connected to the gate electrodes of the middle inverter in the block 12. In turn, the output of the middle inverter is applied to the gate electrodes of the right-hand inverter in the block 12.

The block 12 of FIG. 1 functions as a delay line and edge sharpener which provides rectangular signals at an output node point 37. The leading edges of these output signals are approximately coincident with the respective beginnings of the VSS portions of the VPPS waveform. Reference numeral 38 in FIG. 2 designates the waveform of the rectangular signals that appear at the node point 37. As shown, the frequency of these rectangular signals corresponds with the frequency of the VPPS waveform.

The rectangular signals appearing at the node point 37 of FIG. 1 are applied to the clock terminal (CLK) of the conventional flip-flop 10. In response to each leading edge of a rectangular signal appearing at the node point 37, the flip-flop 10 changes state and provides complementary output signals at output terminals Q and QN, respectively. The terminal QN is directly connected to a data input terminal (D) of the flip-flop. As a result, a waveform designated by reference numeral 40 in FIG. 2 appears at output node point 42 (FIG. 1). It is evident that the repetition rate of the positive-going excursions of the waveform 40 is one-half that of the waveform 38. In effect, the flip-flop 10 thus functions in the depicted circuit as a divide-by-two unit.

The rectangular signal 40 appearing at the node point 42 of FIG. 1 is then applied in parallel to the units 14 and 16. The unit 16 simply inverts the signal 40 and applies a complementary counterpart thereof to the PPS inverter 20. Neglecting the small delay that occurs in the inverter 16, the waveform of the complementary rectangular signal applied to the PPS inverter 20 is as shown in FIG. 2 and designated by reference numeral 44.

The unit 14 of FIG. 1 comprises two series-connected inverters. Thus, the signal that appears at the output of the unit 14 and that is applied to the PPS inverter 18 has a waveform essentially identical to (but slightly delayed from) the waveform 40 of FIG. 2. If the unit 14 is not needed for drive purposes, it may be omitted. In that case, the signal appearing at the node point 42 would be applied directly to the input of the PPS inverter 18.

The rectangular input signals applied to the PPS inverters 18 and 20 serve in effect as masks to allow only specified portions of the waveform of the VPPS power supply to appear on the output lines 26 and 28. Thus, for example, as long as the signal applied to the gate electrodes of the inverter 18 is positive (+5 volts), the n-channel device in the inverter 18 is kept conducting and the output line 26 is maintained at ground potential. Only when the input signal applied to the inverter 18 goes negative (to ground) can the VPPS waveform be coupled via the conducting p-channel device to the output line 26. This is illustrated in FIG. 2 wherein it is evident that the waveform 30 follows the VPPS waveform 22 only during those intervals in which the wavefrom 40 has the value VSS. Whenever the waveform 40 has the value VDD, the output of the PPS inverter 18 is maintained at VSS.

Similarly, as long as the signal applied to the gate electrodes of the inverter 20 is positive, the n-channel device in the inverter 20 is kept conducting and the output line 28 is maintained at ground potential. Only when the input signal applied to the inverter 20 goes negative (to ground) can the VPPS waveform be coupled via the conducting p-channel device to the output line 28. This is illustrated in FIG. 2 wherein it is evident that the waveform 32 follows the waveform 22 only during those intervals in which the waveform 44 has the value VSS. Whenever the waveform 44 has the value VDD, the output of the PPS inverter 20 is maintained at VSS.

Thus, the FIG. 1 circuit provides complementary output signals of the type represented in FIG. 2 by waveforms 30 and 32. These signals, which are derived from and synchronous with the VPPS waveform 22, are utilized to clock data flow in an overall system. Single-ended versions of such clock signals are typically employed to time the operation of a variety of conventional flip-flops and latches. For so-called master/slave-type latches, complementary clock signals of the type depicted in FIG. 2 are needed.

In particular, the complementary clock waveforms 30 and 32 (FIG. 2) generated by the FIG. 1 circuit constitute in practice consistently accurate representations of corresponding portions of the VPPS waveform. And, since these clock signals are derived from and synchronous with VPPS, the utilization of such clock signals to time PPS CMOS circuits insures that the circuits will operate in the advantageous lowpower manner that is characteristic of properly timed PPS circuits.

As described above, the PPS CMOS inverters 18 and 20 of FIG. 1 respond to complementary rectangular input signals to provide output signals that conform to specified portions of the complete PPS waveform. As seen in FIG. 2, the particular portions of the PPS waveform that appear on the output lines 26 and 28 are determined by and thus in effect representative of the waveforms of the rectangular input signals. In accordance with the principles of the present invention, this correspondence between rectangular input signals and PPS-type output signals is utilized to significant advantage in other parts of a digital data system, as illustrated by FIGS. 3 and 4.

Figure 3:
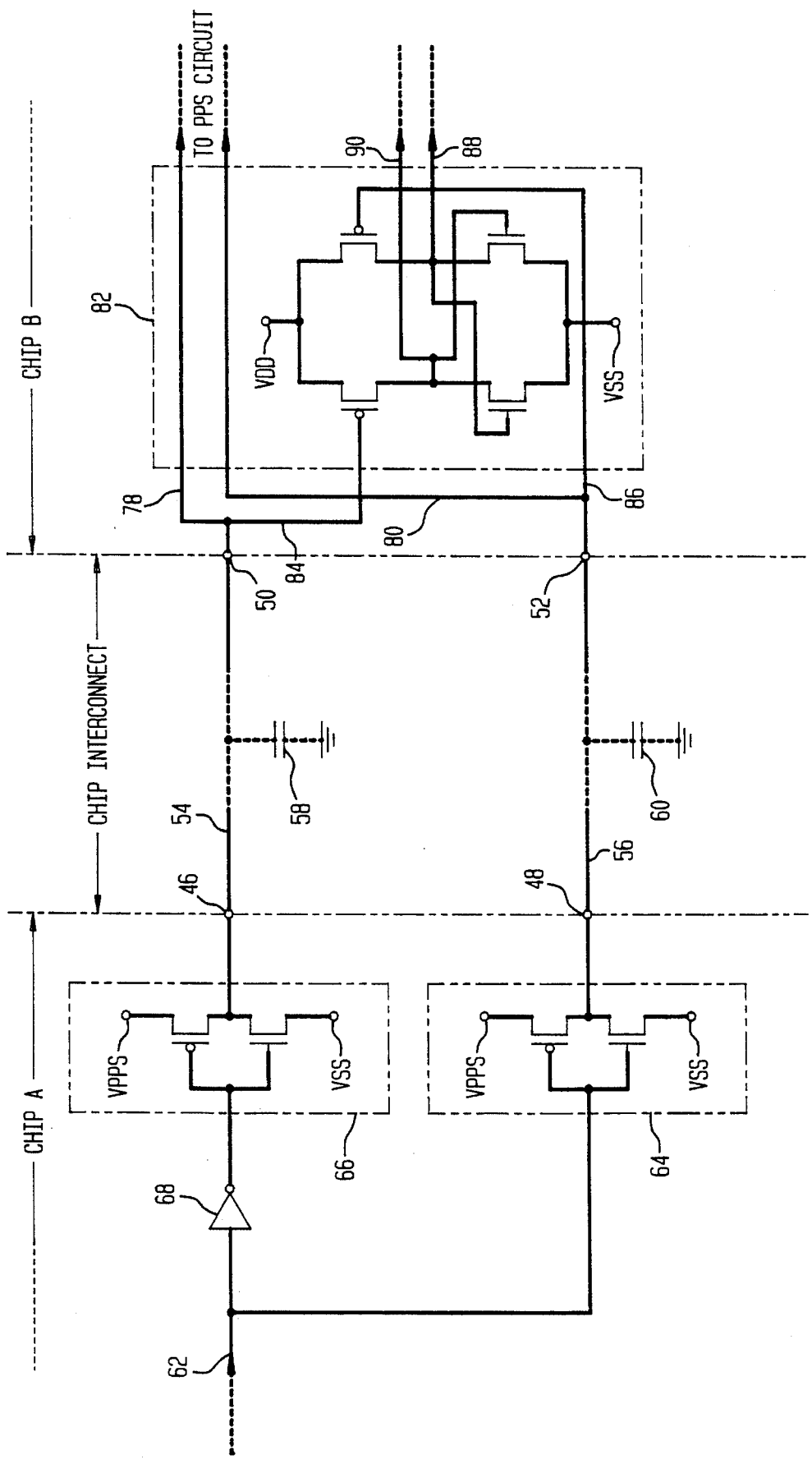
FIG. 3 is a schematic depiction of portions of circuitry included on two chips that are interconnected in accordance with the principles of the present invention.

FIG. 3 represents two semiconductor chips designated A and B. Chip A includes output terminals 46 and 48, and chip B includes input terminals 50 and 52. The terminals of the two chips are connected to each other by interconnect lines 54 and 56. In practice, typical such interconnect arrangements constitute high-capacitance loads as viewed from the output terminals 46 and 48. These loads, which typically have a value of several to 100 picofarads or more, are schematically depicted in FIG. 3 by parasitic capacitors 58 and 60.

A conventional data system typically includes multiple interconnected chips between which digital signals are to be transmitted. Because of the high-capacitance nature of the chip interconnects, relatively high-power output buffers are required in practice to transmit signals between chips. Such high-power buffers are increasingly seen as incompatible with the growing trends to miniaturize electronic equipment and to make such equipment more portable.

In accordance with the principles of the present invention, digital data signals are transmitted between chips in a unique low-power manner. Further, because the generated signals that are transmitted exhibit advantageous rise and fall times, the so-called ground-bounce phenomenon is also significantly reduced relative to conventional circuits. As a result, the noise generated in the inventive arrangement is correspondingly reduced, which improves the noise immunity of the signals therein. A specific illustrative way of transmitting signals between chips is represented in FIG. 3.

In FIG. 3, line 62 on chip A is assumed to carry digital data signals that are to be transmitted via the interconnect lines 54 and 56 to chip B. By way of a particular example, the signals on the line 62 are further assumed to be conventional single-ended (or single-rail) rectangular representations of digital data. In accordance with the invention, the digital representation on the line 62 is applied to the depicted chip interconnect arrangement via PPS CMOS inverters. By employing such PPS CMOS inverters as output buffers, it is possible to transmit signals to chip B utilizing about five times less power than if conventional CMOS inverters powered by a fixed-value power supply were used.

Illustratively, so as to balance the load on the PPS waveform generator (not shown) and thus to make that generator operate in a consistently stable way, it is generally advantageous to provide a balanced or double-ended output buffer on chip A. Accordingly, as shown in FIG. 3, the digital signal appearing on the line 62 is applied directly to the input of PPS CMOS inverter 64 and is applied to the input of a substantially identical PPS CMOS inverter 66 via a conventional CMOS inverter 68 that is powered by a fixed-value power supply. The complementary balanced digital signals that are thereby applied to the PPS CMOS output buffers 64 and 66 are shown in FIG. 4 wherein they are designated by reference numerals 70 and 72, respectively. Moreover, the conventional PPS waveform that is utilized to power the inverters 64 and 66 is also shown in FIG. 4 (designated by reference numeral 74).

For illustrative purposes, assume herein that a voltage level of VDD is indicative of a binary "1" signal and that a voltage level of VSS is indicative of a binary "0" signal. In that case, the particular waveform 70 applied to the PPS inverter 64 is representative of a digital data stream comprising "1', "0", "1" and "1" signals, as shown in FIG. 4. And the complementary waveform 72 is thus representative of a data stream comprising "0", "1", "0" and "0" signals.

The rectangular waveform 70 (FIG. 4) applied to the PPS inverter 64 (FIG. 3) serves to gate to the output terminal 48 specified portions of the VPPS waveform applied to the source electrodes of the p-channel device of the inverter 64. Similarly, the rectangular waveform 72 applied to the PPS inverter 66 serves to gate a complementary version of the same specified portions of the VPPS waveform to the output terminal 46.

In particular, as long as the input signal 70 applied to the gate electrodes of the inverter 64 of FIG. 3 is positive (+5 volts), the n-channel device in the inverter 64 is kept conducting and the voltage at the output terminal 48 is maintained at ground potential. Only when the input signal applied to the inverter 64 goes negative (to ground) can the VPPS waveform be coupled via the conducting p-channel device to the output terminal 48. This is illustrated in FIG. 4 wherein it is evident that waveform 75 follows the VPPS waveform 74 only during those intervals in which the waveform 70 has the value VSS. Whenever the waveform 70 has the value VDD, the output of the PPS inverter 64 is maintained at VSS.

Thus, the PPS-type signal 75 (FIG. 4) appearing at the output terminal 48 and applied to the interconnect line 56 of FIG. 3 is in effect an inverted or complementary representation of the digital data waveform 70 applied to the line 62. When the waveform 70 is relatively positive (indicative of a "1"), the waveform 75 is relatively negative (indicative of a "0"). Conversely, when the waveform 70 is relatively negative (a "0"), the waveform 75 is relatively positive (indicative of a "1").

Similarly, as long as the input signal 72 applied to the gate electrodes of the inverter 66 of FIG. 3 is positive (+5 volts), the n-channel device in the inverter 66 is kept conducting and the voltage at the output terminal 46 is maintained at ground potential. Only when the input signal applied to the inverter 66 goes negative (to ground), can the VPPS waveform be coupled via the conducting p-channel device to the output terminal 46. This is illustrated in FIG. 4 wherein it is seen that waveform 76 follows the VPPS waveform 74 only during those intervals in which the waveform 72 has the value VSS. Whenever the waveform 72 has the value VDD, the output of the PPS inverter 66 is maintained at VSS.

Hence, the PPS-type signal 76 (FIG. 4) appearing at the output terminal 46 and applied to the interconnect line 54 of FIG. 3 is in effect a representation of the digital data waveform 70 applied to the line 62. When the waveform 70 is relatively positive (indicative of a "1"), the waveform 76 is also relatively positive (indicative of a "1"). Conversely, when the waveform 70 is relatively negative (indicative of a "0"), the waveform 76 is also relatively negative (indicative of a "0").

Accordingly, the complementary PPS-type signals applied to the interconnect lines 54 and 56 by the PPS inverters 64 and 66 constitute an exact double-ended representation of the digital data signals appearing on the input line 62. And, as specified earlier above, by employing PPS CMOS inverters (rather than conventional CMOS inverters powered by a fixed-value power supply) as the output drivers on chip A, the transmission of signals from chip A to chip B is carried out in an advantageous relatively low-power way.

Illustratively, the PPS-type signals applied to the input terminals 50 and 52 of chip B of FIG. 3 may be applied directly to other PPS circuits on chip B. This is indicated in FIG. 3 by lines 78 and 80 which are connected to the input terminals 50 and 52, respectively.

In further accordance with the principles of the present invention, the PPS-type signals applied to the input terminals 50 and 52 of chip B of FIG. 3 are also applied to a flip-flop circuit 82 via lines 84 and 86. The circuit 82 functions in effect as a self-timed memory cell which responds to complementary PPS-type signals applied thereto via the input lines 84 and 86 to provide on output lines 88 and 90 counterpart complementary rectangular signals. In that way, the signals appearing on the lines 88 and 90 of chip B constitute replicas of the digital representations originally applied to the PPS inverters 64 and 66 on chip .A. In turn, the rectangular signals on the lines 88 and 90 are available to be applied, for example, to conventional CMOS circuits powered by a fixed-value power supply.

To understand the operation of the cell 82 of FIG. 3, consider, for example, its condition at time t2 shown in FIG. 4. At that time, a relatively positive voltage (see the waveform 75) is applied via the line 86 to the gate electrode of the right-hand p-channel device in the cell 82 and a relatively negative voltage (see the waveform 76) is applied via the line 84 to the gate electrode of the left-hand p-channel device in the cell 82. In response to such PPS-type inputs, the right-hand p-channel device is nonconducting and the left-hand p-channel device conducts. At the same time, the right-hand n-channel device is thereby rendered conductive and the left-hand n-channel device is maintained in its nonconducting state. As a result, a relatively positive voltage (VDD) indicative of a "1" signal appears on the line 90 and a relatively negative voltage (VSS) indicative of a "0"signal appears on the line 88. Importantly, the signals appearing on the lines 88 and 90 are in effect slightly delayed replicas of the digital data signals originally applied to the inputs of the PPS inverters 64 and 66, respectively, during the time interval t1-to-t3. Thus, these replicas are also representative of the single-ended "0"signal applied to the input line 62 on chip A during the interval t1-to-t3.

The digital representation stored in the cell 82 of FIG. 3 subsequent to t2 remains in effect trapped therein (stored on parasitic capacitances) at the aforespecified value until a subsequent positive-going signal appears on the line 84. Thus, at some time between t3 and t4, the positive-going excursion of the waveform 76 (FIG. 4) causes the cell 82 to change state. In its changed state, the left-hand p-channel device and the right-hand n-channel device are nonconducting while the right-hand p-channel device and the left-hand n-channel device conduct. As a result, a relatively positive voltage (VDD) indicative of a "1" signal appears on the line 88 and a relatively negative voltage (VSS) indicative of a "0"signal appears on the line 90. These signals on the lines 88 and 90 are in effect slightly delayed replicas of the digital data signals originally applied to the inputs of the PPS inverters 64 and 66, respectively, during the time interval t3-to-t5. And these replicas are representative of the single-ended "1" signal originally applied to the input line 62 on chip A during the interval t3-to-t5. Moreover, these signals on the lines 88 and 90 remain representative of the afore-specified value until a subsequent time when a positive-going signal appears on the line 86. Thus, during a time corresponding approximately to the entire input interval t3-to-t6, the double-ended digital indication on the lines 88 and 90 remains representative of the successive "0"signals originally applied to the input 62.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed is:

1. A CMOS clock signal generating circuit comprising
   an input terminal adapted to be connected to a pulsed power supply that is characterized by a waveform that repetitively cycles at a specified repetition rate in a ramped fashion between a voltage designated VDD and a point of reference potential designated VSS,
   means connected to said input terminal and responsive to said ramped waveform being applied to said input terminal for generating complementary rectangular signals each of whose repetition rates is one-half that of the specified repetition rate of said ramped waveform,
   first and second inverters each including a p-channel device having gate, source and drain electrodes and an n-channel device having gate, source and drain electrodes,
   means in each inverter directly connecting the drain electrode of said p-channel device to the drain electrode of said n-channel device,
   power supply leads adapted to be connected to said pulsed power supply and to VSS,
   means connecting the source electrodes of the n-channel and p-channel devices in said inverters to said power supply leads,
   means directly connecting together the gate electrodes of the n-channel and p-channel devices in each of said first and second inverters,
   and means for applying said complementary rectangular signals to the respective connected-together gate electrodes in said inverters to provide at the respective connected-together drain electrodes of said inverters complementary clock output signals that each correspond to portions of said ramped waveform and that are synchronous with said ramped waveform.

2. A circuit as in claim 1, wherein said means for generating complementary rectangular signals comprises
   first means responsive to said ramped waveform being applied to said input terminal for generating first rectangular signals whose repetition rate corresponds with said specified rate,
   second means responsive to said first rectangular signals for generating second rectangular signals whose repetition rate is one-half that of said first rectangular signals,
   and third means responsive to said second rectangular signals for applying a counterpart of said second rectangular signals and an inverted version thereof to the respective connected-together gate electrodes of said inverters.

3. A circuit as in claim 2 wherein said first means comprises series-connected CMOS inverters adapted to be connected to a fixed-value direct-current power supply.

4. A circuit as in claim 3 wherein said second means comprises a flip-flop.

5. A circuit as in claim 4 wherein said third means comprises CMOS inverters adapted to be connected to a fixed-value power supply.

* * * * *